United States Patent
Ge et al.

(10) Patent No.: US 7,208,754 B2
(45) Date of Patent: Apr. 24, 2007

(54) STRAINED SILICON STRUCTURE

(75) Inventors: Chung-Hu Ge, Taipei (TW);
Wen-Chin Lee, Hsin-Chu (TW);
Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 66 days.

(21) Appl. No.: 11/114,981

(22) Filed: Apr. 26, 2005

(65) Prior Publication Data

US 2005/0194658 A1    Sep. 8, 2005

Related U.S. Application Data

(62) Division of application No. 10/699,574, filed on Oct. 31, 2003, now Pat. No. 6,902,965.

(51) Int. Cl.
*H01L 29/06* (2006.01)

(52) U.S. Cl. ............................. 257/19; 257/18; 257/20; 257/510; 257/E31.035; 257/E29.193; 438/424

(58) Field of Classification Search ................ 257/19, 257/20, 12, 15, 22, 510
See application file for complete search history.

(56) References Cited

U.S. PATENT DOCUMENTS

| | | |
|---|---|---|
| 4,072,974 A | 2/1978 | Ipri |
| 4,631,803 A | 12/1986 | Hunter et al. |
| 5,013,681 A | 5/1991 | Godbey et al. |
| 5,024,723 A | 6/1991 | Goesele et al. |
| 5,213,986 A | 5/1993 | Pinker et al. |
| 5,374,564 A | 12/1994 | Bruel |
| 5,447,884 A | 9/1995 | Fahey et al. |

(Continued)

FOREIGN PATENT DOCUMENTS

WO    WO 03/017336 A2    2/2003

OTHER PUBLICATIONS

Ismail, K., et al., "Electron Transport Properties of Si/SiGe Heterostructures: Measurements and Device Implications," Applied Physics Letter, vol. 63, No. 5, (Aug. 2, 1993), pp. 660-662.

(Continued)

*Primary Examiner*—Jerome Jackson
*Assistant Examiner*—Paul Budd
(74) *Attorney, Agent, or Firm*—Slater & Matsil, L.L.P.

(57) ABSTRACT

A semiconductor device includes a substrate, a first epitaxial layer, a second epitaxial layer, a third epitaxial layer, a first trench, and a second trench. The first epitaxial layer is formed on the substrate. The first layer has lattice mismatch relative to the substrate. The second epitaxial layer is formed on the first layer, and the second layer has lattice mismatch relative to the first layer. The third epitaxial layer is formed on the second layer, and the third layer has lattice mismatch relative to the second layer. Hence, the third layer may be strained silicon. The first trench extends through the first layer. The second trench extends through the third layer and at least partially through the second layer. At least part of the second trench is aligned with at least part of the first trench, and the second trench is at least partially filled with an insulating material.

20 Claims, 6 Drawing Sheets

U.S. PATENT DOCUMENTS

| | | | |
|---|---|---|---|
| 5,461,250 | A | 10/1995 | Burghartz et al. |
| 5,468,657 | A | 11/1995 | Hsu |
| 5,534,713 | A | 7/1996 | Ismail et al. |
| 5,633,588 | A | 5/1997 | Hommei et al. |
| 5,659,192 | A | 8/1997 | Sarma et al. |
| 5,663,588 | A | 9/1997 | Suzuki et al. |
| 5,714,777 | A | 2/1998 | Ismail et al. |
| 5,739,574 | A | 4/1998 | Nakamura |
| 5,759,898 | A | 6/1998 | Ek et al. |
| 5,763,315 | A | 6/1998 | Benedict et al. |
| 5,769,991 | A | 6/1998 | Miyazawa et al. |
| 5,863,830 | A | 1/1999 | Bruel et al. |
| 5,882,981 | A | 3/1999 | Rajgopal et al. |
| 5,904,539 | A | 5/1999 | Hause et al. |
| 6,046,487 | A | 4/2000 | Benedict et al. |
| 6,059,895 | A | 5/2000 | Chu et al. |
| 6,143,070 | A | 11/2000 | Bliss et al. |
| 6,159,824 | A | 12/2000 | Henley et al. |
| 6,258,664 | B1 | 7/2001 | Reinberg |
| 6,291,321 | B1 | 9/2001 | Fitzgerald |
| 6,335,231 | B1 | 1/2002 | Yamazaki et al. |
| 6,355,541 | B1 | 3/2002 | Holland et al. |
| 6,358,791 | B1 | 3/2002 | Hsu et al. |
| 6,358,806 | B1 | 3/2002 | Puchner |
| 6,368,938 | B1 | 4/2002 | Usenko |
| 6,407,406 | B1 | 6/2002 | Tezuka |
| 6,410,371 | B1 | 6/2002 | Yu et al. |
| 6,410,938 | B1 | 6/2002 | Xiang |
| 6,429,061 | B1 | 8/2002 | Rim |
| 6,475,838 | B1 | 11/2002 | Bryant et al. |
| 6,486,008 | B1 | 11/2002 | Lee |
| 6,518,644 | B2 | 2/2003 | Fitzgerald |
| 6,524,905 | B2 | 2/2003 | Yamamichi et al. |
| 6,558,998 | B2 | 5/2003 | Belleville et al. |
| 6,830,976 | B2* | 12/2004 | Fitzgerald .................. 438/287 |
| 2002/0011628 | A1* | 1/2002 | Takagi ........................ 257/368 |
| 2002/0076899 | A1 | 6/2002 | Skotnicki et al. |
| 2002/0123197 | A1* | 9/2002 | Fitzgerald et al. .......... 438/285 |
| 2002/0140031 | A1 | 10/2002 | Rim |
| 2002/0153549 | A1 | 10/2002 | Laibowitz et al. |
| 2003/0030091 | A1 | 2/2003 | Butsara et al. |
| 2003/0049893 | A1 | 3/2003 | Currie et al. |
| 2004/0097025 | A1 | 5/2004 | Fitzgerald et al. |
| 2004/0173812 | A1 | 9/2004 | Currie et al. |
| 2004/0180509 | A1* | 9/2004 | Wang et al. ................. 438/424 |
| 2004/0224469 | A1* | 11/2004 | Lim et al. ................... 438/285 |
| 2005/0082571 | A1* | 4/2005 | Ohnishi et al. ............. 257/198 |
| 2006/0189109 | A1* | 8/2006 | Fitzgerald ................... 438/586 |

OTHER PUBLICATIONS

Nayak, D.K., et al., "Enhancement-Mode Quantum-Well $Ge_xSi_{1-x}$ PMOS," IEEE Electron Device Letters, vol. 12, No. 4, (Apr. 1991), pp. 154-156.

Gámiz, F., et al., "Strained-Si/SiGe-on-Insulator Inversion Layers: The Role of Strained-Si Layer Thickness on Electron Mobility," Applied Physics Letter, vol. 80, No. 22, (Jun. 3, 2002), pp. 4160-4162.

Gámiz, F., et al., "Electron Transport in Strained Si Inversion Layers Grown on SiGe-on-Insulator Substrates," Journal of Applied Physics, vol. 92, No. 1, (Jul. 1, 2002), pp. 288-295.

Mizuno, T., et al., "Novel SOI p-Channel MOSFETs With Higher Strain in Si Channel Using Double SiGe Heterostructures," IEEE Transactions on Electron Devices, vol. 49, No. 1, (Jan. 2002), pp. 7-14.

Tezuka, T., et al., "High-Performance Strained Si-on-Insulator MOSFETs by Novel Fabrication Processes Utilizing Ge-Condensation Technique," Symposium On VLSI Technology Digest of Technical Papers, (2002), pp. 96-97.

Jurczak, M. et al., "Silicon-on-Nothing (SON)—an Innovative Process for Advanced CMOS," IEEE Transactions on Electron Devices, vol. 47, No. 11, (Nov. 2000), pp. 2179-2187.

Jurczak, M., et al., "SON (Silicon on Nothing)—A New Device Architecture for the ULSI Era," Symposium on VLSI Technology Digest of Technical Papers, (1999), pp. 29-30.

Maiti, C.K., et al., "Film Growth and Material Parameters," Application of Silicon-Germanium Heterostructure Devices, Institute of Physics Publishing, Ch. 2 (2001) pp. 32-42.

Tiwari, S., et al., "Hole Mobility Improvement in Silicon-on-Insulator and Bulk Silicon Transistors Using Local Strain," International Electron Device Meeting, (1997), pp. 939-941.

Ootsuka, F., et al., "A Highly Dense, High-Performance 130nm Node CMOS Technology for Large Scale System-on-a-Chip Applications," International Electron Device Meeting, (2000), pp. 575-578.

Matthews, J.W., et al., "Defects in Epitaxial Multilayers—I. Misfit Dislocations," Journal of Crystal Growth, vol. 27, (1974), pp. 118-125.

Matthews, J.W., et al., "Defects in Epitaxial Multilayers—II. Dislocation Pile-Ups, Threading Dislocations, Slip Lines and Cracks", Journal of Crystal Growth, vol. 29, (1975), pp. 273-280.

Matthews, J.W., et al., "Defects in Epitaxial Multilayers—III. Preparation of Almost Perfect Multilayers," Journal of Crystal Growth, vol. 32, (1976), pp. 265-273.

Schuüppen, A., et al., "Mesa and Planar SiGe-HBTs on MBE-Wafers," Journal of Materials Science: Materials in Electronics, vol. 6, (1995), pp. 298-305.

Matthews, J.W., "Defects Associated with the Accommodation of Misfit Between Crystals," J. Vac. Sci. Technol., vol. 12, No. 1 (Jan./Feb. 1975), pp. 126-133.

Current, M.I., et al., "Atomic-Layer Cleaving and Non-Contact Thinning and Thickening for Fabrication of Laminated Electronic and Photonic Materials," 2001 Materials Research Society Spring Meeting (Apr. 16-20, 2001).

Current, M.I., et al., "Atomic-layer Cleaving with $Si_x Ge_y$ Strain Layers for Fabrication of Si and Ge-rich SOI Device Layers," 2001 IEEE SOI Conference (Oct. 1-4, 2001) pp. 11-12.

Langdo, T.A., et al., "Preparation of Novel SiGe-Free Strained Si on Insulator Substrates," 2002 IEEE International SOI Conference (Aug. 2002) pp. 211-212.

Rim, K., et al., "Fabrication and Analysis of Deep Submicron Strained-Si N-MOSFETs," IEEE Transactions on Electron Devices, vol. 47, No. 7 (Jul. 2000) pp. 1406-1415.

Shimizu, A., et al., "Local Mechanical-Stress Control (LMC): A New Technique for CMOS-Performance Enhancement," International Electron Devices Meeting (2001) pp. 433-436.

Thompson, S., et al., "A 90 nm Logic Technology Featuring 50nm Strained Silicon Channel Transistors, 7 Layers of Cu Interconnects, Low k ILD, and 1 $um^2$SRAM Cell," IEDM (Dec. 2002) pp. 61-64.

Welser, J., et al., "NMOS and PMOS Transistors Fabricated in Strained Silicon/Relaxed Silicon-Germanium Structures," International Electron Devices Meeting (Dec. 1992) pp. 1-3.

Wang, L.K., et al., "On-Chip Decoupling Capacitor Design to Reduce Switching-Noise-Induced Instability in CMOS/SOI VLSI," Proceedings of the 1995 IEEE International SOI Conference, Oct. 1995, pp. 100-101.

Yeoh, J.C., et al., "MOS Gated Si: SiGe Quantum Wells Formed by Anodic Oxidation," Semicond. Sci. Technol. (1998), vol. 13, pp. 1442-1445, IOP Publishing Ltd., UK.

Cavassilas, N., et al., "Capacitance-Voltage Characteristics of Metal-Oxide-Strained Semiconductor Si/SiGe Heterostructures," Nanotech 2002, vol. 1, pp. 600-603.

Fitzgerald, E.A., et al., "Elimination of Interface Defects in Mismatched Epilayers by a Reduction in Growth Area," Appl. Phys. Lett. 52 (1B) (May 2, 1988) pp. 1496-1498.

Waite, A., et al., "SiGe pMOSFETs Fabricated on Limited area SiGe Virtual Substrates," Mat. Res. Soc. Symp. Proc., vol. 745 (2003) pp. 99-103.

* cited by examiner

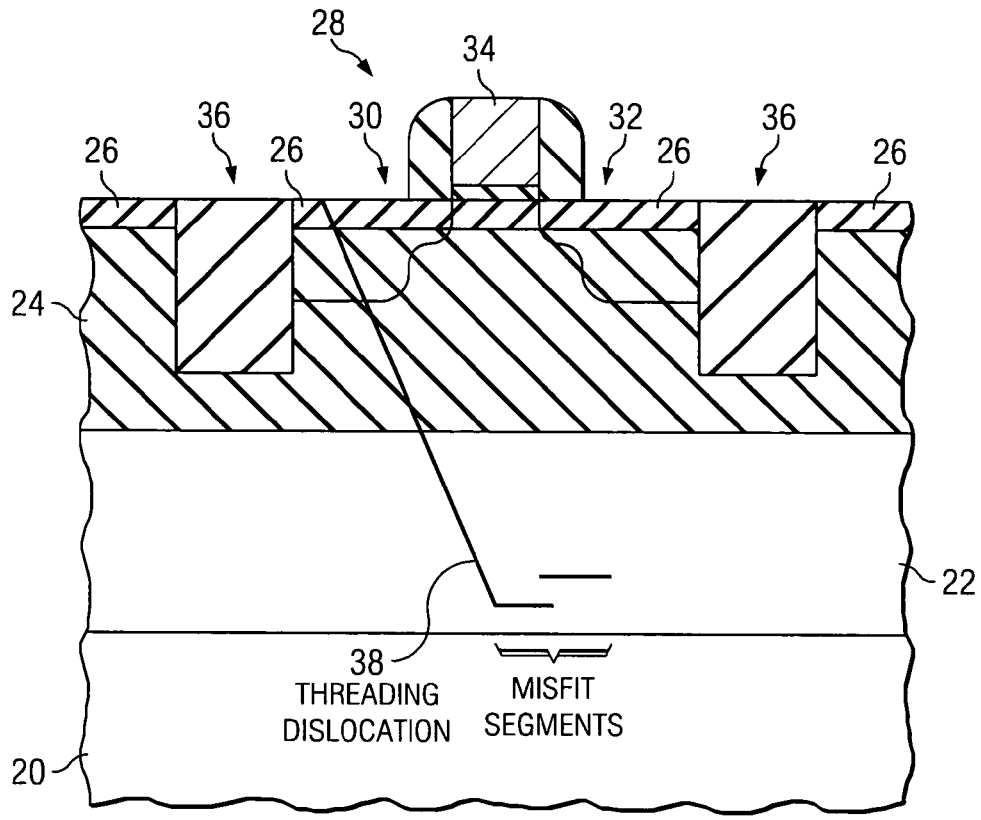
*FIG. 1A*
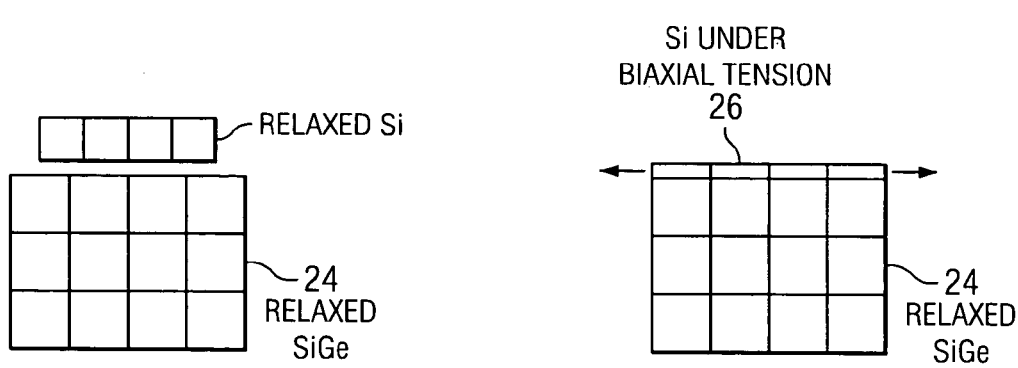
*FIG. 1B*  *FIG. 1C*

STRAINED SILICON STRUCTURE

This application is a divisional of patent application Ser. No. 10/699,574, entitled "Strained Silicon Structure," filed on Oct. 31, 2003, now U.S. Pat. No. 6,902,965, which application is incorporated herein by reference.

TECHNICAL FIELD

The present invention generally relates to the fabrication of semiconductor devices. In one aspect it relates more particularly to a strained silicon structure.

BACKGROUND

Complementary metal-oxide-semiconductor (CMOS) technology is a dominant semiconductor technology used for the manufacture of ultra-large scale integrated (ULSI) circuits today. Size reduction of the metal-oxide-semiconductor field-effect transistor (MOSFET) has provided significant improvement in the speed performance, circuit density, and cost per unit function of semiconductor chips over the past few decades. Significant challenges are faced when CMOS devices are scaled into the sub-100 nm regime. An attractive approach for additional improvement of CMOS transistor performance exploits strain-induced band-structure modification and mobility enhancement to increase the transistor drive current. Enhanced electron and hole mobilities in silicon (Si) under biaxial tensile strain can be achieved. Enhanced electron and hole mobilities improve the drive currents of N-channel and P-channel MOSFETs, respectively. In the strained silicon, electrons experience less resistance and flow up to 70 percent faster, which can lead to chips that are up to 35 percent faster without having to further shrink the size of transistors.

As shown in FIG. 1A, many designs of strained silicon layers for transistor fabrication utilize buffer layers or complex multi-layer structures on a bulk silicon substrate 20. Strained silicon substrate technology often utilize a silicon-germanium (SiGe) graded buffer layer 22 with a thickness in the order of microns. A relaxed SiGe layer 24 overlies the graded buffer layer 22. The relaxed SiGe layer 24 has a larger natural lattice constant than that of silicon. Relaxed crystalline silicon is said to be lattice-mismatched with respect to relaxed crystalline SiGe due to the difference in their lattice constants. As a result, a thin layer of silicon 26 that is epitaxially grown on the relaxed SiGe layer 24 will be under biaxial tensile strain because the lattice of the thin layer of silicon 26 is forced to align to the lattice of the relaxed crystalline SiGe layer 24, as illustrated in FIGS. 1B and 1C. Referring again to FIG. 1A, a transistor 28 is formed in the silicon layer 26. The transistor 28 includes a source 30, a drain 32 and a gate 34. Transistors fabricated on the strained silicon layer 26 will have enhanced electrical performance. As also shown in FIG. 1A, the transistor 28 is typically bounded by an isolation region 36 (e.g., shallow-trench isolation (STI), local oxidation of silicon (LOCOS), field oxide (FOX)).

The graded SiGe buffer layer 22 introduces a lattice mismatch with the underlying silicon substrate 20, which may result in a dispersed, three-dimensional misfit dislocation network. Strain-relieving glide of threading dislocations 38 is facilitated. Dislocations formed in the graded buffer layer 22 may propagate to the wafer surface, resulting in a defect density in the order of $10^4$–$10^5$ defects per $cm^2$. Such a high defect density may present a significant barrier for the production of integrated circuits using such substrates. Also, the underlying strain fields of the misfit arrays result in a characteristic cross-hatch surface roughness. This surface roughness can be a significant problem as it potentially degrades channel mobility in active devices. Hence, there is a need for a way to reduce defect density for such strained silicon substrate structures.

SUMMARY OF THE INVENTION

The problems and needs outlined above may be addressed by embodiments of the present invention. In accordance with one aspect of the present invention, a semiconductor device is provided, which includes a substrate, a first epitaxial layer, a second epitaxial layer, a third epitaxial layer, a first trench, and a second trench. The first epitaxial layer is formed on the substrate. The first layer has lattice mismatch relative to the substrate. The second epitaxial layer is formed on the first layer, and the second layer has lattice mismatch relative to the first layer. The third epitaxial layer is formed on the second layer, and the third layer has lattice mismatch relative to the second layer. The first trench extends through the first layer. The second trench extends through the third layer and at least partially through the second layer. At least part of the second trench is aligned with at least part of the first trench, and the second trench is at least partially filled with an insulating material.

In accordance with another aspect of the present invention, a method of manufacturing a semiconductor device, is provided. This method includes the following steps described in this paragraph, and the order of steps may vary. A substrate is provided. A first epitaxial layer is formed on the substrate. The first layer has lattice mismatch relative to the substrate. A first trench is formed in the first layer. A second epitaxial layer is formed on the first layer. The second layer has lattice mismatch relative to the first layer. A third epitaxial layer is formed on the second layer. The third layer has lattice mismatch relative to the second layer. A second trench is formed in the third and second layers. At least part of the second trench is in alignment with at least part of the first trench.

In accordance with yet another aspect of the present invention, a method of manufacturing a semiconductor device, is provided. This method includes the following steps described in this paragraph, and the order of steps may vary. A substrate is provided. A first epitaxial layer is formed on the substrate. The first layer has lattice mismatch relative to the substrate. A second epitaxial layer on the first layer. The second layer has lattice mismatch relative to the first layer. A first trench is formed in the second and first layers. A third epitaxial layer is formed on the second layer. The third layer has lattice mismatch relative to the second layer. A second trench is formed in the third and second layers. At least part of the second trench is in alignment with at least part of the first trench.

BRIEF DESCRIPTION OF THE DRAWINGS

The following is a brief description of the drawings, which illustrate exemplary embodiments of the present invention and in which:

FIG. 1A is a cross-section view of a transistor formed on a strained silicon substrate in accordance with a prior design;

FIGS. 1B and 1C illustrate a way to form a silicon layer under biaxial tension;

DETAILED DESCRIPTION OF ILLUSTRATIVE EMBODIMENTS

Figure 2:
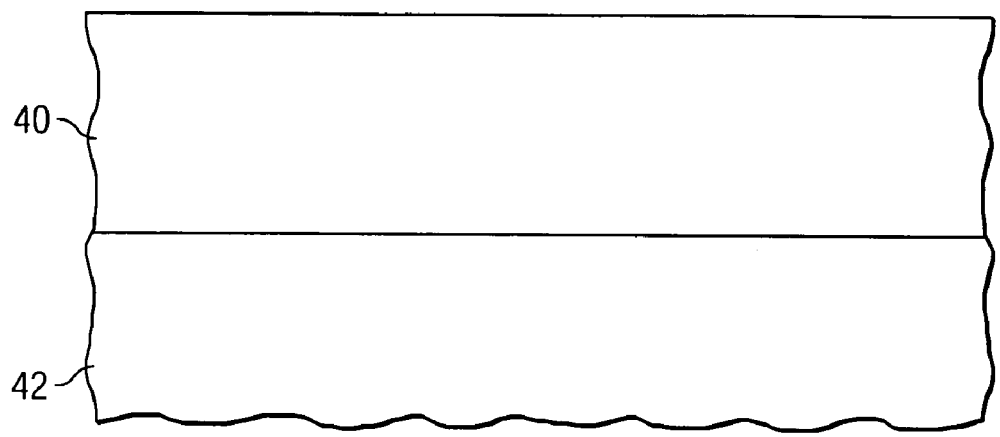
FIGS. 2–7 illustrate steps of forming a first illustrative embodiment of the present invention.

Referring now to the drawings, wherein like reference numbers are used herein to designate like elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

FIGS. 2–11 show process steps for two illustrative embodiments of the present invention. An embodiment of the present invention provides a way to reduce defect density in an improved strained silicon structure, as compared to the prior design (see FIG. 1A), for example. One of the primary mechanisms for achieving reduced defect density in an embodiment of the present invention is providing free surfaces for grain boundaries so that dislocations will migrate to the free surfaces. By strategically locating such free surfaces away from the channel region (where the transistor will reside), dislocations may be moved away from the channel region (i.e., towards or to the free surfaces). The following description of these two illustrative embodiments will illustrate how an embodiment of the present invention may provide such free surfaces and thereby reduce defect density at the channel region.

FIGS. 2–7 show process steps for a first illustrative embodiment of the present invention. Beginning at FIG. 2, a first lattice mismatched epitaxial layer 40 is formed on a substrate 42. In this example, the substrate 42 is silicon (e.g., silicon wafer) and the first layer 40 is a SiGe buffer layer. The first layer 40 preferably has lattice mismatch relative to the substrate 42.

Figure 3:
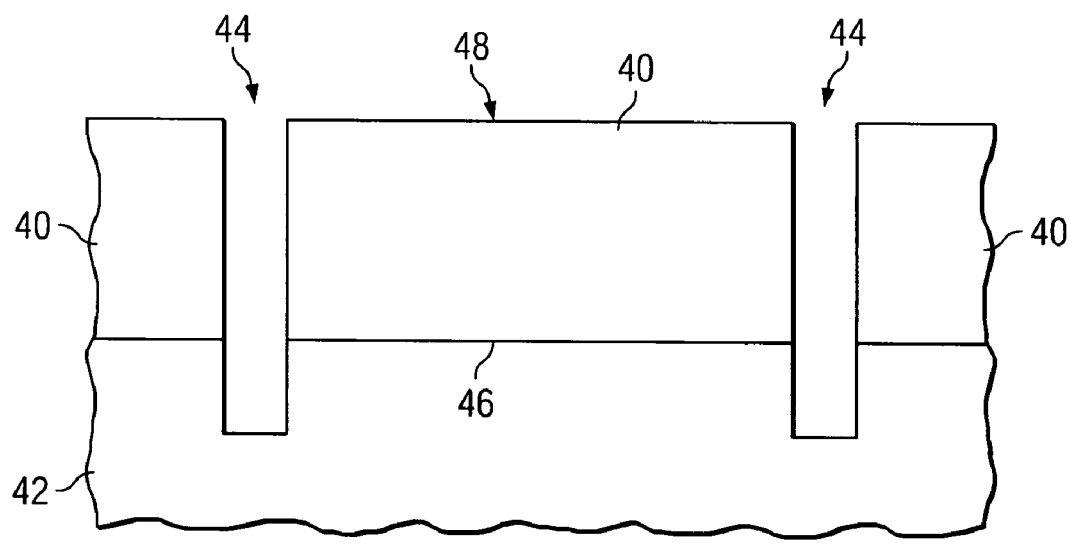

Next, as shown in FIG. 3, a first trench 44 is formed in the first layer 40. In FIG. 3, two parts of the first trench 44 are shown. The plan-view layout of the first trench 44 may vary, depending upon the layout of the active areas. Also, the depth and width of the first trench 44 may vary. In this case (FIG. 3), the first trench 44 extends through the first layer 40 and into the substrate 42. It is preferable that the first trench 44 extends through the interface 46 of the first layer 40 and the substrate 42. In other embodiments (not shown), the first trench 44 may extend only partially through the first layer 40 or only through the first layer 40 and not into the substrate 42.

The first layer 40 may be annealed after forming the first trench 44. Such annealing may be performed at an annealing temperature that is about 100° C. higher than the deposition temperature used in forming the first layer 40, for example. Annealing the first layer 40 may remove dislocations or defects in the crystalline structure of the first layer 40, and/or may cause dislocations within the first layer 40 to migrate to or towards a free surface (e.g., at the first trench 44). The top surface 48 of the first layer 40 may be planarized (before or after the formation of the first trench 44) prior to forming the second layer 50 thereon (described further below). The planarization may be performed by any appropriate planarization process, such as chemical-mechanical polishing (CMP), for example. If the first layer 40 is annealed, it is preferable to perform the planarization after the annealing, but the planarization may be performed before the annealing. In other embodiments, the annealing of the first layer 40 and/or the planarizing of the first layer 40 may not be performed.

Figure 4:
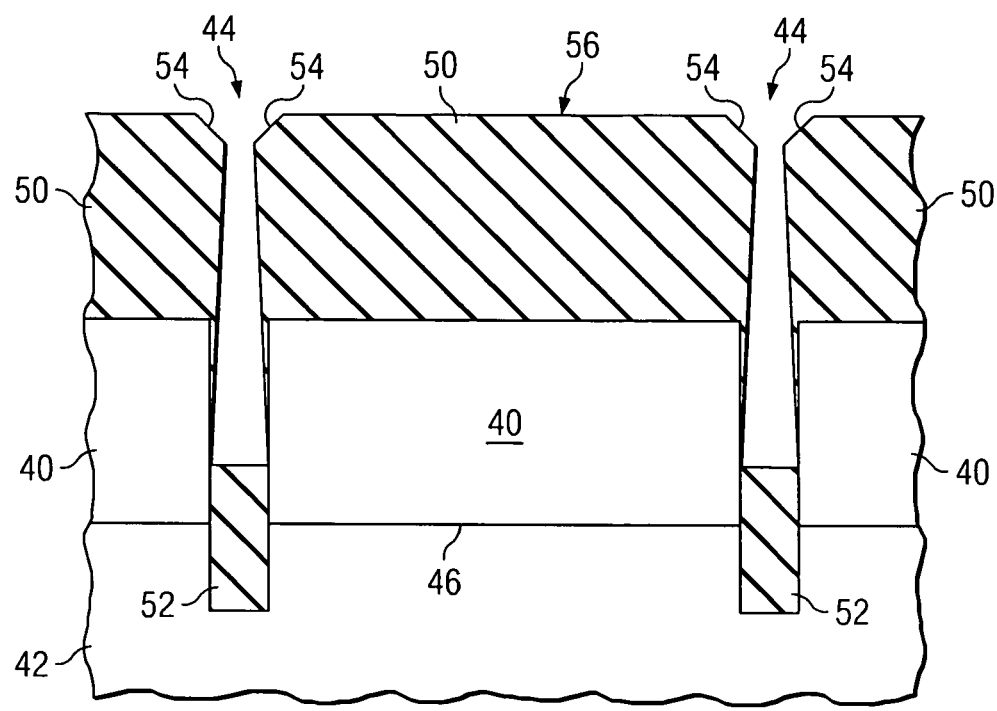

As shown in FIG. 4, a second lattice mismatched epitaxial layer 50 is formed on the first layer 40. In this example, the second layer 50 is a relaxed SiGe layer. As shown in FIG. 4, material of the second layer 50 may partially fill the first trench 44 (see portions 52 in FIG. 4). Alternatively, the first trench 44 may be filled or partially filled with another material (e.g., insulating material) (not shown) prior to forming the second layer 50 on the first layer 40. Although the first trench 44 remains open after forming the second layer 50 in this example (see FIG. 4) and effectively extends up through the second layer 50, the first trench 44 may be closed by the second layer 50. This will depend on the overhangs 54 formed, if any, by the second layer material at the first trench 44 and the width of the first trench 44. It is preferable, but not necessary, that the first trench 44 remains open at this stage.

As with the first layer 40, the second layer 50 may be annealed. Such annealing may be performed at an annealing temperature that is about 100° C. higher than the deposition temperature used in forming the second layer 50, for example. Annealing the second layer 50 may remove dislocations or defects in the crystalline structure of the second layer 50, and/or may cause dislocations within the second layer 50 to migrate to or towards a free surface (e.g., at the first trench 44). The top surface 56 of the second layer may be planarized prior to forming the third layer 60 thereon (described further below). If the second layer 50 is annealed, it is preferable to perform the planarization after the annealing, but the planarization may be performed before the annealing. In other embodiments, the annealing of the second layer 50 and/or the planarizing of the second layer 50 may not be performed.

Figure 5:
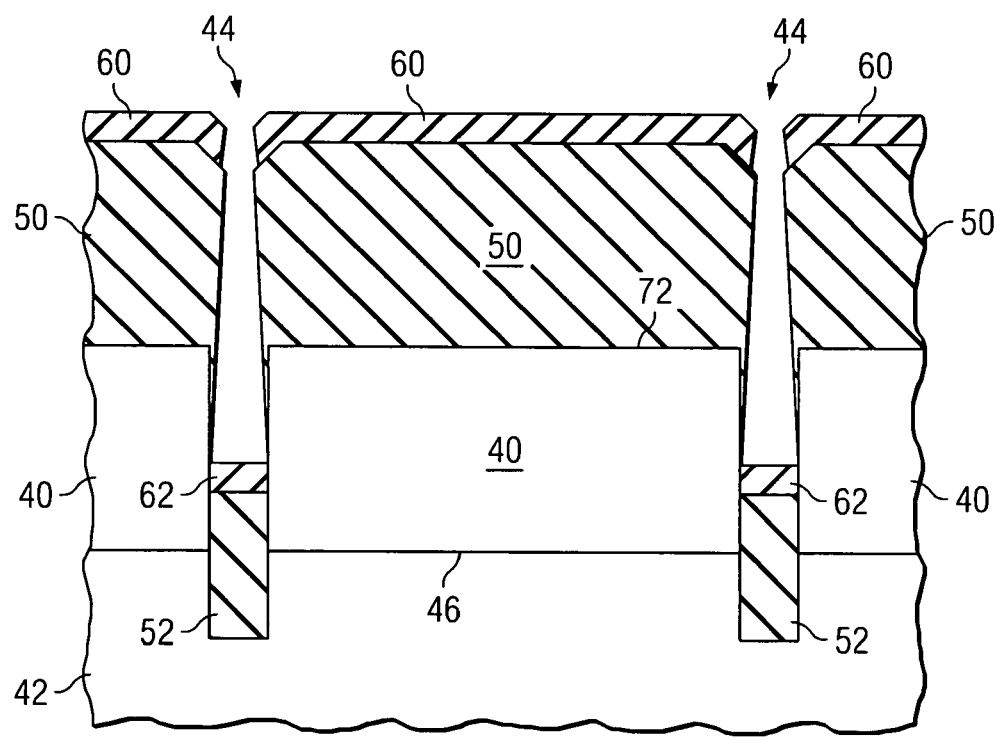

In FIG. 5, a third lattice mismatched epitaxial layer 60 has been formed on the second layer 50. The third layer 60 is strained (under biaxial tension) due to the lattice mismatch between the second layer 50 and the third layer 60. The third layer 60 in this case is strained silicon under biaxial tension (see e.g., FIG. 1C). As shown in FIG. 5, the material of the third layer 60 may partially fill the first trench 44 (see portions 62 in FIG. 5). Although the first trench 44 remains open after forming the third layer 60 in this example (see FIG. 5), the first trench 44 may be closed by the formation of the third layer 60. This will depend on the overhangs formed, if any, by the third layer material 60 at the first trench 44 and the width of the first trench 44.

The first and second layers 40, 50 may each have a thickness of about 2–3 µm, for example. The third layer 60 needs to be thin enough that it will not generate dislocations therein. If the third layer 60 is too thick, a crack or dislocation may form due to stress from the lattice constant difference between the second and third layers 50, 60. The third layer 60 may have a thickness of about 200 Å, for example. As mentioned above, the first and second layers 40, 50 may be SiGe layers. In such case, the second layer 50 preferably has a higher concentration of germanium than the first layer 40 to create a lattice mismatch between them. The first layer 40 may be a graded SiGe layer, for example. The first (40), second (50), and third (60) layers, each may be different and each may be formed from any of a variety of materials or combinations/compounds of materials, including (but not limited to): silicon, germanium, carbon, compound semiconductors, and combinations thereof, for example.

Although the first and second layers 40, 50 are each shown as single layers, either or both may be composite layers (i.e., a layer made from multiple layers). For example, the first layer 40 may include a graded composition layer and a uniform composition layer. Similarly, the second layer 50 may include a graded composition layer and a uniform composition layer, for example. Although the substrate 42 is shown in the illustrative embodiments herein as a silicon wafer, the substrate 42 may be a silicon-on-insulator (SOI) structure (not shown), or the substrate 42 may include an insulator layer over a silicon layer (not shown), for example. With the benefit of this disclosure one of ordinary skill in the art may realize many other possible material variations and/or layer compositions for an embodiment of the present invention.

In forming the first (40), second (50), and third (60) layers, any of a variety of epitaxial layer formation processes/technologies (or combinations thereof) may be used, including (but not limited to): chemical vapor deposition (CVD), MOCVD, H-CVD, atomic layer deposition, strained silicon molecular beam epitaxy (SS-MBE), and combinations thereof, for example.

Figure 6:
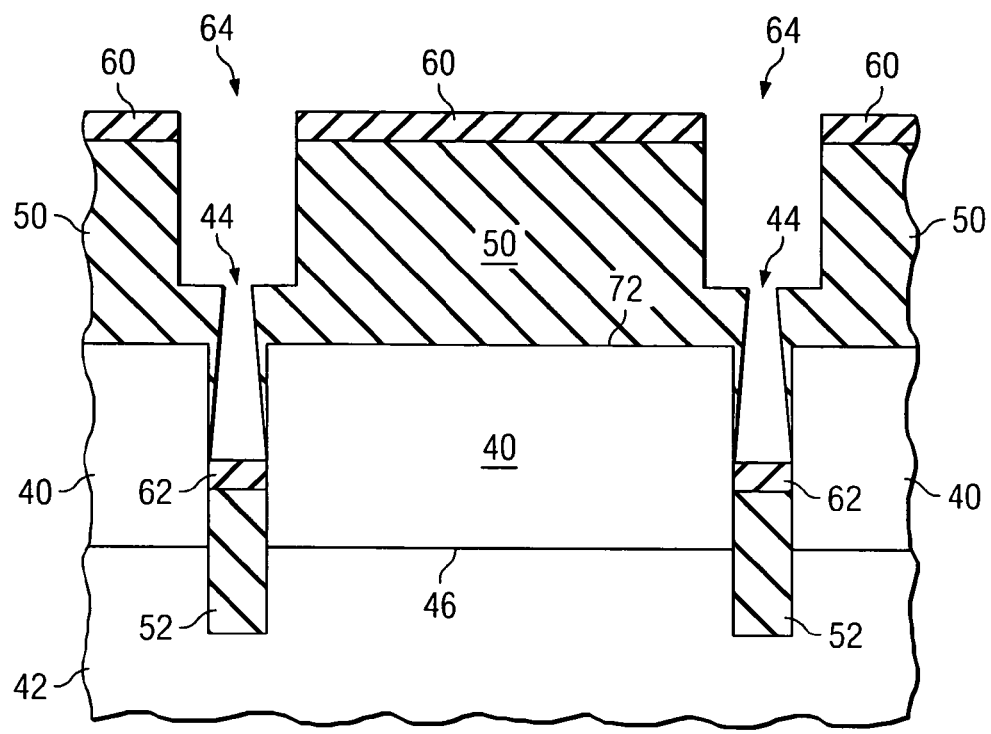

In FIG. 6, a second trench 64 has been formed in the third and second layers 60, 50. At least part of the second trench 64 is in alignment (i.e., horizontal alignment) with at least part of the first trench 44, as shown in FIG. 6. In other words, the second trench 64 is located over the first trench 44. However, the second trench 64 need not be centered relative to the first trench 44 while being aligned with it. Preferably, the second trench 64 is aligned with the first trench 44 and has a depth so that the second trench 64 connects with and opens to the first trench 44. This will depend on the depth of the second trench 64 into the second layer 50 and whether the second layer material (i.e., overhang portions 54 of second layer 50 in first trench 44) closes the first trench 44 at the bottom of the second trench 64. In a preferred embodiment, the second trench 64 has a depth of about 300 Å, for example.

In the example embodiment shown in FIG. 6, the second trench 64 extends through the third layer 60 and partially through the second layer 50. In other embodiments (not shown), the second trench 64 may extend through the second layer 50 but not into the first layer 40. In still other embodiments (not shown), the second trench 64 may extend through the second layer 50 and into the first layer 40. The width of the second trench 64 is preferably wider than the first trench 44. However, in other embodiments (not shown), the width for part or all of the second trench 64 may be smaller than or equal to the width for part or all of the first trench 44, for example. Preferably, the second trench 64 is the same as that normally used for shallow trench isolation (e.g., see STI 36 shown in FIG. 1A).

Figure 7:
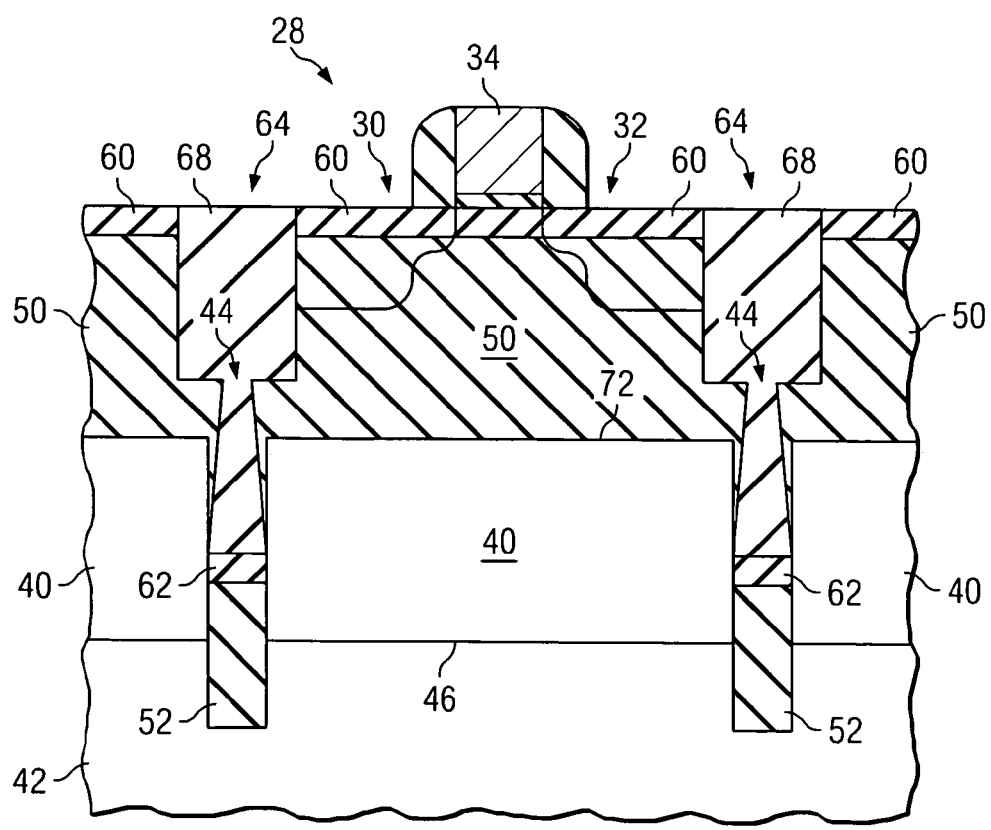
Figure 8:
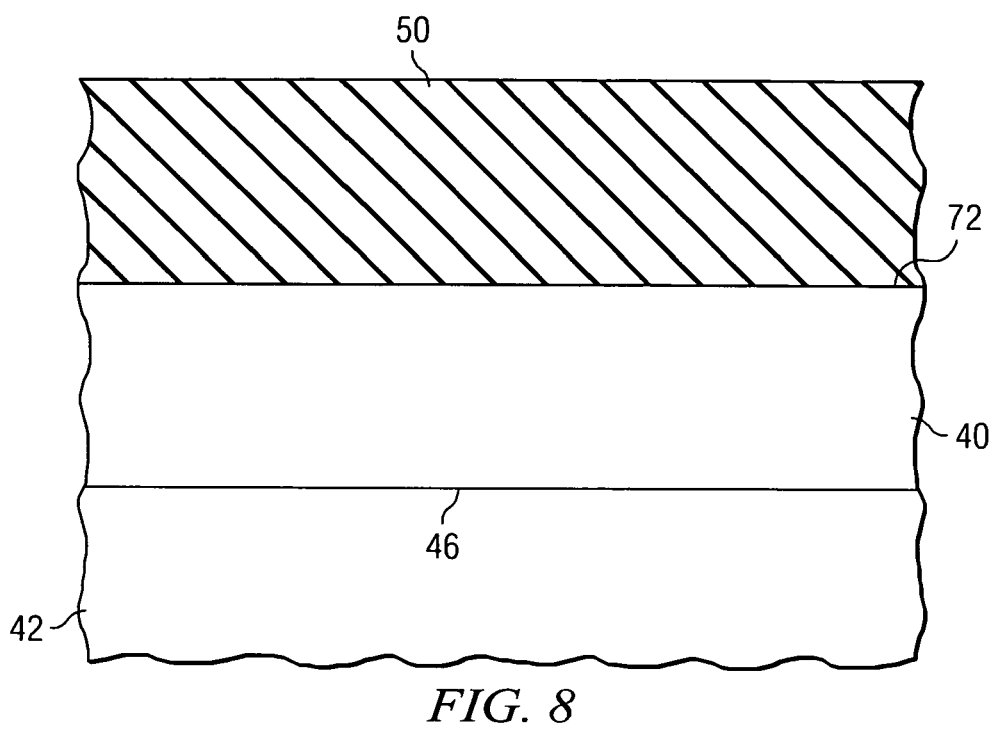
FIGS. 8–11 illustrate steps of forming a second illustrative embodiment of the present invention.

In FIG. 7, the second trench 64 and the unfilled portions of the first trench 44 have been filled with an insulating material 68. Hence, the filled second trench 64 acts as a isolation region for the active area. Also shown in FIG. 7, for purposes of illustration, a transistor 28 has been formed. Part of the transistor 28 is formed in the third layer 60 (i.e., in the strained silicon layer in this example).

The first trench 44 provides a free surface for dislocations to migrate to, which allows defects to be moved away from the channel region of the transistor 28. It is desirable to eliminate or reduce the number of defects in the channel region. Dislocations in the channel region may cause electrical leakage, for example. The first trench 44 is located under the shallow trench isolation (STI) region (i.e., the second trench 64). This provides the advantage of moving dislocations and/or defects to the region beneath or at the STI region. It is generally not problematic to have defects at or below the STI region, as it is away from the channel region and typically will not affect the performance of the device(s) formed in the active region. Also, the first trench 44 crosses the interface 72 of the first and second layers 40, 50. This relieves stress at this interface 72 to reduce or eliminate dislocations under the channel region.

FIGS. 8–11 show process steps for a second illustrative embodiment of the present invention. The second embodiment shown in FIGS. 8–11 is similar to the first embodiment shown in FIGS. 2–7, except that the first trench 44 is formed after the second layer 50 is formed (rather than before the second layer 50 is formed). Beginning at FIG. 8, a first lattice mismatched epitaxial layer 40 (e.g., SiGe layer) is formed on a substrate 42 (e.g., silicon wafer), and a second lattice mismatched epitaxial layer 50 (e.g., relaxed SiGe layer of higher Ge concentration than the first layer 40) is formed on the first layer 40. The first layer 40 may be annealed and/or planarized before the second layer 50 is formed thereon (e.g., as described above with respect to the first embodiment).

Figure 9:
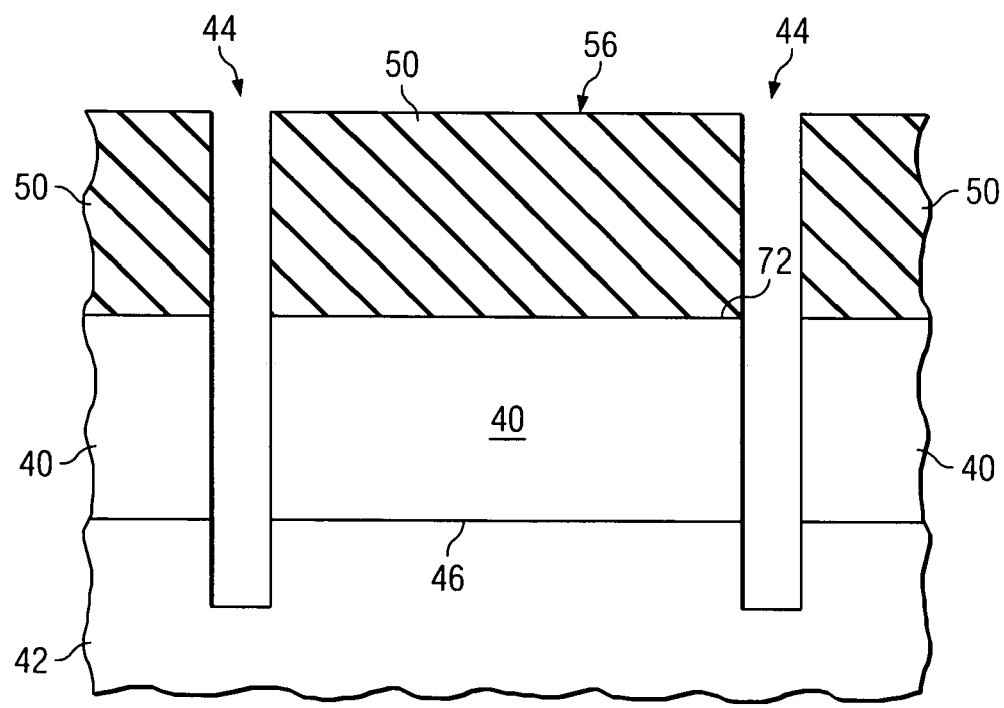

As shown in FIG. 9, a first trench 44 is formed in the second and first layers 50, 40. In the example embodiment shown in FIG. 9, the first trench 44 extends through the second layer 50, through the first layer 40, and into the substrate 42, which is preferred. In other embodiments (not shown), the first trench 44 may extend through the second layer 50 and into the first layer 40 (but not into the substrate 42). In such cases, the first trench 44 may extend partially or entirely through the first layer 40. The second layer 50 may be annealed and/or planarized before the third layer 60 is formed thereon (e.g., as described above with respect to the first embodiment).

Figure 10:
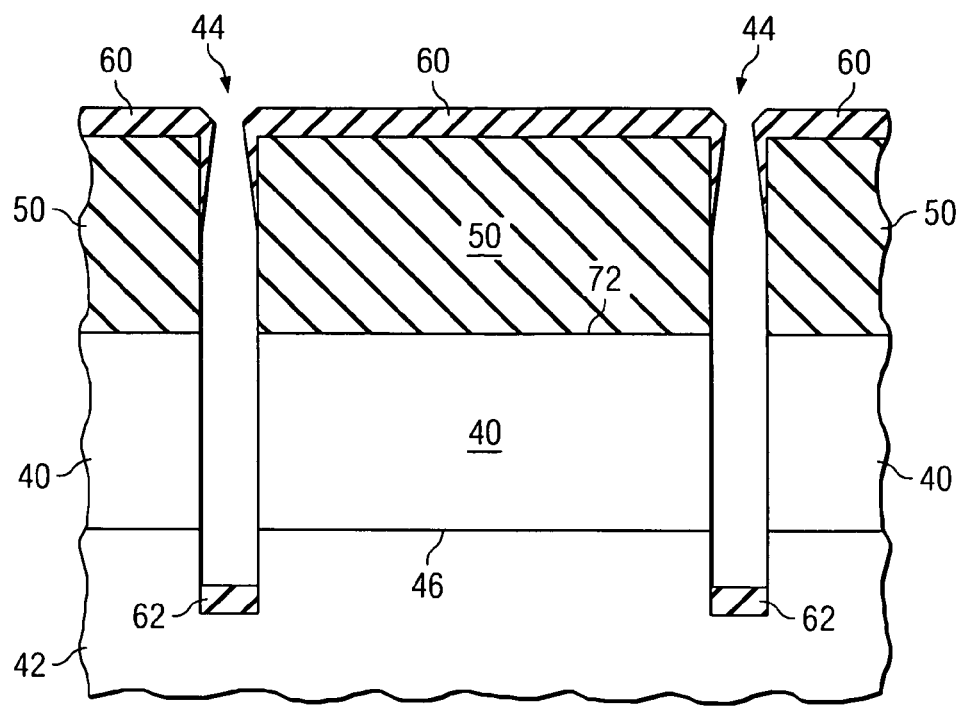
Figure 11:
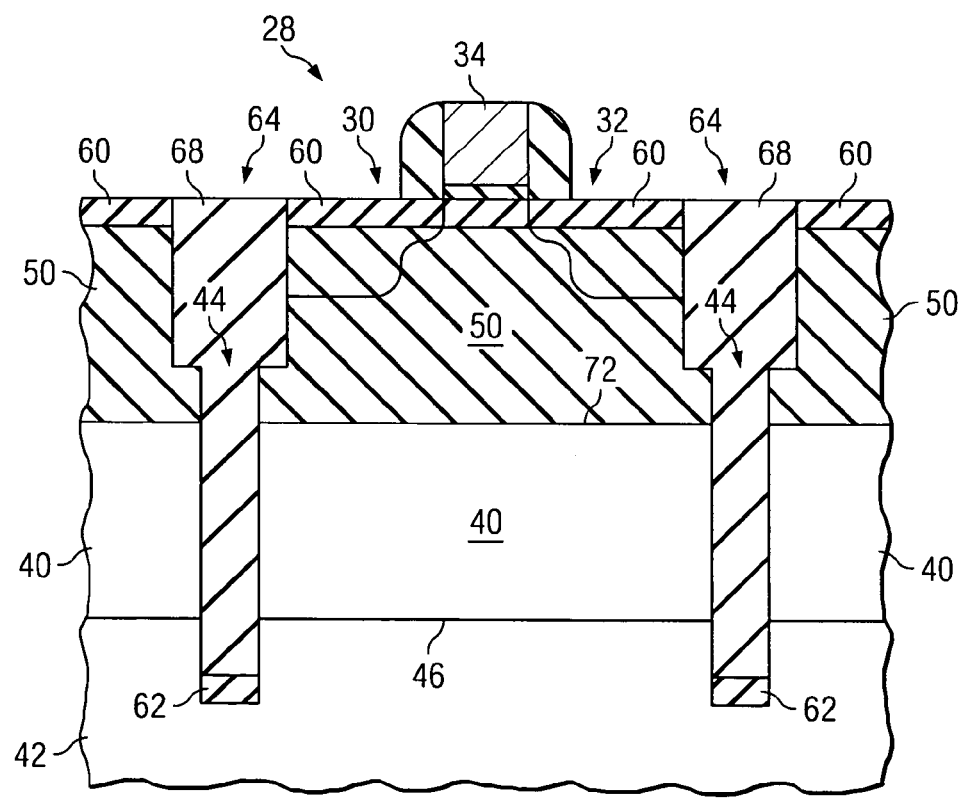

In FIG. 10, a third lattice mismatched epitaxial layer 60 (e.g., silicon) is formed on the second layer 50. The third layer 60 is strained due to the lattice mismatch between the second layer 50 and the third layer 60. The third layer material 62 may partially fill the first trench, as shown in FIG. 10. In FIG. 11, a second trench 64 has been formed in alignment with the first trench 44 (as described above regarding the first embodiment), and the second trench 64 has been filled with an insulating material 68 to form an isolation region. The insulating material 68 also fills the open remainder of the first trench 44, as shown in FIG. 11. The second trench 64 may extend partially or completely through the second layer 50. In another embodiment (not shown), the second trench 64 may extend to, partially into, and/or completely through the first layer 40, for example. As in FIG. 7, a transistor 28 is shown in FIG. 11 for purposes of illustrating an example use of a strained silicon structure.

In yet another embodiment of the present invention (not shown), e.g., as a variation upon and/or additional step to the first embodiment and/or the second embodiment, a trench may be formed in the substrate 42 before the first layer 40 is formed on the substrate 42. Depending upon the depth and width of such a trench in the substrate 42, it may or may not be filled by the material of the first layer 40 when the first layer is formed. Preferably, such a trench in the substrate 42 is depth enough and/or wide enough that the trench extends through the first layer 40 after the first layer is formed (in spite of overhang and filling by the first layer material), as the second layer 50 does in FIG. 4, for example. With the benefit of this disclosure, one of ordinary skill in the art may realize many other variations and embodiments of the present invention.

It will be appreciated by those skilled in the art having the benefit of this disclosure that embodiments the present invention provide methods of forming a strained silicon structure. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A semiconductor device, comprising:
   a substrate;
   a first epitaxial layer formed on the substrate, the first layer having lattice mismatch relative to the substrate;
   a second epitaxial layer formed on the first layer, the second layer having lattice mismatch relative to the first layer;
   a third epitaxial layer formed on the second layer, the third layer having lattice mismatch relative to the second layer;
   a first trench extending through the first layer, the first trench having first trench sidewalls;
   a second trench extending through the third layer and at least partially through the second layer, at least part of the second trench being aligned with at least part of the first trench, the second trench being at least partially filled with an insulating material, the second trench having second trench sidewalls, and at least one of the second trench sidewalls not being aligned with at least one of the first trench sidewalls.

2. The semiconductor device of claim 1, wherein part of the first trench extends through at least part of the second layer.

3. The semiconductor device of claim 1, wherein part of the first trench extends into the substrate.

4. The semiconductor device of claim 1, wherein the first trench is at least partially filled with the insulating material.

5. The semiconductor device of claim 1, wherein the first trench is at least partially filled with material of the second layer.

6. The semiconductor device of claim 1, wherein the first trench is at least partially filled with material of the third layer.

7. The semiconductor device of claim 1, wherein the second trench connects with the first trench.

8. The semiconductor device of claim 1,
   wherein the substrate comprises silicon,
   wherein the first layer comprises silicon germanium,
   wherein the second layer comprises relaxed silicon germanium, and
   wherein the third layer comprises strained silicon.

9. The semiconductor device of claim 1, further comprising:
   a transistor formed adjacent to the second trench and at least partially in the third layer.

10. A semiconductor device, comprising:
    a substrate;
    a first epitaxial layer formed on the substrate, the first layer having lattice mismatch relative to the substrate;
    a second epitaxial layer formed on the first layer, the second layer having lattice mismatch relative to the first layer;
    a third epitaxial layer formed on the second layer, the third layer having lattice mismatch relative to the second layer;
    a first trench extending at least partially through the first layer, the first trench being at least partially filled with material of the second layer;
    a second trench extending through the third layer and at least partially through the second layer, at least part of the second trench being aligned with at least part of the first trench, and the second trench being at least partially filled with an insulating material.

11. The semiconductor device of claim 10, wherein material of the third layer at least partially fills the first trench.

12. The semiconductor device of claim 10,
    wherein the first trench extends through the first layer and into the substrate, and
    wherein the second trench connects with the first trench.

13. A semiconductor device, comprising:
    a substrate;
    a first epitaxial layer formed on the substrate, the first layer having lattice mismatch relative to the substrate;
    a second epitaxial layer formed on the first layer, the second layer having lattice mismatch relative to the first layer;
    a third epitaxial layer formed on the second layer, the third layer having lattice mismatch relative to the second layer;
    a first trench extending at least partially through the second layer and at least partially through the first layer;
    a second trench extending through the third layer and at least partially through the second layer, at least part of the second trench being aligned with at least part of the first trench, the second trench being at least partially filled with an insulating material, and the second trench being wider than the first trench.

14. The semiconductor device of claim 13, wherein the first trench extends through the first layer.

15. The semiconductor device of claim 13, wherein the first trench extends through the first layer and into the substrate.

16. The semiconductor device of claim 13, wherein the first trench is at least partially filled with the insulating material.

17. The semiconductor device of claim 13, wherein the first trench is at least partially filled with material of the third layer.

18. The semiconductor device of claim 13, wherein the second trench connects with the first trench.

19. The semiconductor device of claim 13,
    wherein the substrate comprises silicon,
    wherein the first layer comprises silicon germanium,
    wherein the second layer comprises relaxed silicon germanium, and
    wherein the third layer comprises strained silicon.

20. The semiconductor device of claim 13, further comprising:
    a transistor formed adjacent to the second trench and at least partially in the third layer.

* * * * *

UNITED STATES PATENT AND TRADEMARK OFFICE
CERTIFICATE OF CORRECTION

| | |
|---|---|
| PATENT NO. | : 7,208,754 B2 |
| APPLICATION NO. | : 11/114981 |
| DATED | : April 24, 2007 |
| INVENTOR(S) | : Ke et al. |

It is certified that error appears in the above-identified patent and that said Letters Patent is hereby corrected as shown below:

Title Page;
Section 12; delete "Ge, et al." insert --Ke, et al.--
Section 75; delete " Chung-Hu Ge" insert--Chung-Hu Ke--

Signed and Sealed this

Third Day of July, 2007

JON W. DUDAS
*Director of the United States Patent and Trademark Office*